US007489589B2

United States Patent
Chen et al.

(10) Patent No.: US 7,489,589 B2
(45) Date of Patent: Feb. 10, 2009

(54) MRAM INTERNAL CLOCK PULSE GENERATION WITH AN ATD CIRCUIT AND THE METHOD THEREOF

(75) Inventors: Kuang-Lun Chen, St. Paul, MN (US); James Chyi Lai, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 215 days.

(21) Appl. No.: 11/530,663

(22) Filed: Sep. 11, 2006

(65) Prior Publication Data

US 2007/0058481 A1    Mar. 15, 2007

Related U.S. Application Data

(60) Provisional application No. 60/716,199, filed on Sep. 12, 2005.

(51) Int. Cl.
*G11C 8/18* (2006.01)
(52) U.S. Cl. ............. 365/233.5; 365/233.1; 365/230.01
(58) Field of Classification Search .............. 365/233.5, 365/233.1, 230.01
See application file for complete search history.

(56) References Cited

U.S. PATENT DOCUMENTS 5,548,560 A * 8/1996 Stephens et al. ......... 365/233.5
6,075,750 A * 6/2000 Campardo et al. ....... 365/233.5

* cited by examiner

*Primary Examiner*—Anh Phung
*Assistant Examiner*—Nam Nguyen
(74) *Attorney, Agent, or Firm*—Thomas, Kayden, Horstemeyer & Risley

(57) ABSTRACT

A magnetic random access memory having an extended address transition detection circuit having a chip enable input, a chip write enable input, a data bus connection, and an address bus connection. The extended address transition detection circuit has an extended transition detection signal output. The magnetic random access memory has a timing controller with a timing control input connected to the address transition detection signal output. The chip enable input, the chip write enable input, the data bus connection, and the address bus connection are buffered and driven off chip.

5 Claims, 1 Drawing Sheet

MRAM INTERNAL CLOCK PULSE GENERATION WITH AN ATD CIRCUIT AND THE METHOD THEREOF

CROSS-REFERENCE TO RELATED APPLICATION

This application claims the priority benefit of U.S. Provisional Application Ser. No. 60/716,199, filed Sep. 12, 2005, the full disclosures of which are incorporated herein by reference.

BACKGROUND

1. Field of Invention

The invention relates to a magnetic random access memory, and more particularly, to the operation of an asynchronous MRAM with an internally generated clocking plus and an ATD (Address Transition Device) circuit.

2. Description of Related Art

Typical Magnetic Random Access Memory, MRAM, structures have a nonmagnetic layer sandwiched between two ferromagnetic films. The two ferromagnetic films are also known as magnetic thin films. The MRAM employs the magneto resistive properties of this structure to store data. In each storage element, an MRAM employs two lines, commonly termed a word line and a sense string, in order to detect the magnetization direction of these magnetic thin films. Each string comprises a magnetic thin film that serves as a memory element, and the word line generally addresses multiple sense strings. Magnetic thin films that have a parallel moment have a low resistance and are typically assigned the '1' state. Magnetic thin films having an anti-parallel moment have a high resistance and are typically assigned the '0' state, but may also be assigned to the '1' state.

During a read operation, a word current passes through the word line causing the magnetic layers in the sense string to rotate, thereby changing the resistance in the sense string. A sense current passes through the sense string. A sense line receives the signal from the sense string. A differential amplifier compares the signal from the sense line to a reference line to determine whether a one resistance or a zero resistance is stored in the MRAM. A differential amplifier notes the change in voltage across the sense line to determine resistive state of a storage element.

With any asynchronous circuit, a signal transition on any input will elicit an internal response. An asynchronous MRAM is no different in the uncontrolled case. Being a memory structure, an MRAM has two operational cycles, namely a read cycle and a write cycle. If an input such as an address signal were to change during the critical part of a write operation, neither could its completion nor the address location of the operation be guaranteed. It is possible to create indeterminate states within the MRAM itself at indeterminate locations under these conditions. If the address signal changed during a read operation, then the output would become an indeterminate state as the actual address location being read could transition during the read cycle.

Prior solutions involve other internal clock pulse generation schemes and circuitry that are not suitable for MRAM due to limited functionality and the unique demands of a asynchronous magnetic random access memory. In the traditional usage an address transition detector is used for memory address signals.

What is needed is a transition detector for other signals such as the data signals as well as the chip enable (NCE) and write enable (NWE) signals.

SUMMARY

One embodiment of the present invention solves these needs and other problems in the field of asynchronous MRAM operation by providing, in most preferred aspects a magnetic random access memory comprising: an extended address transition detection circuit having a chip enable input, a chip write enable input, a data bus connection, an address bus connection, with the extended address transition detection circuit having an extended transition detection signal output; and a timing controller having a timing control input connected to the address transition detection signal output.

The embodiment of the present invention also provides in the most preferred aspect a magnetic random access memory where the chip enable input is buffered.

The embodiment of the present invention also provides in the most preferred aspects a magnetic random access memory where the write enable input is buffered.

The embodiment of the present invention also provides in the most preferred aspects a magnetic random access memory where the address bus connection is buffered.

The embodiment of the present invention also provides in the most preferred aspects a magnetic random access memory where the data bus connection is buffered.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
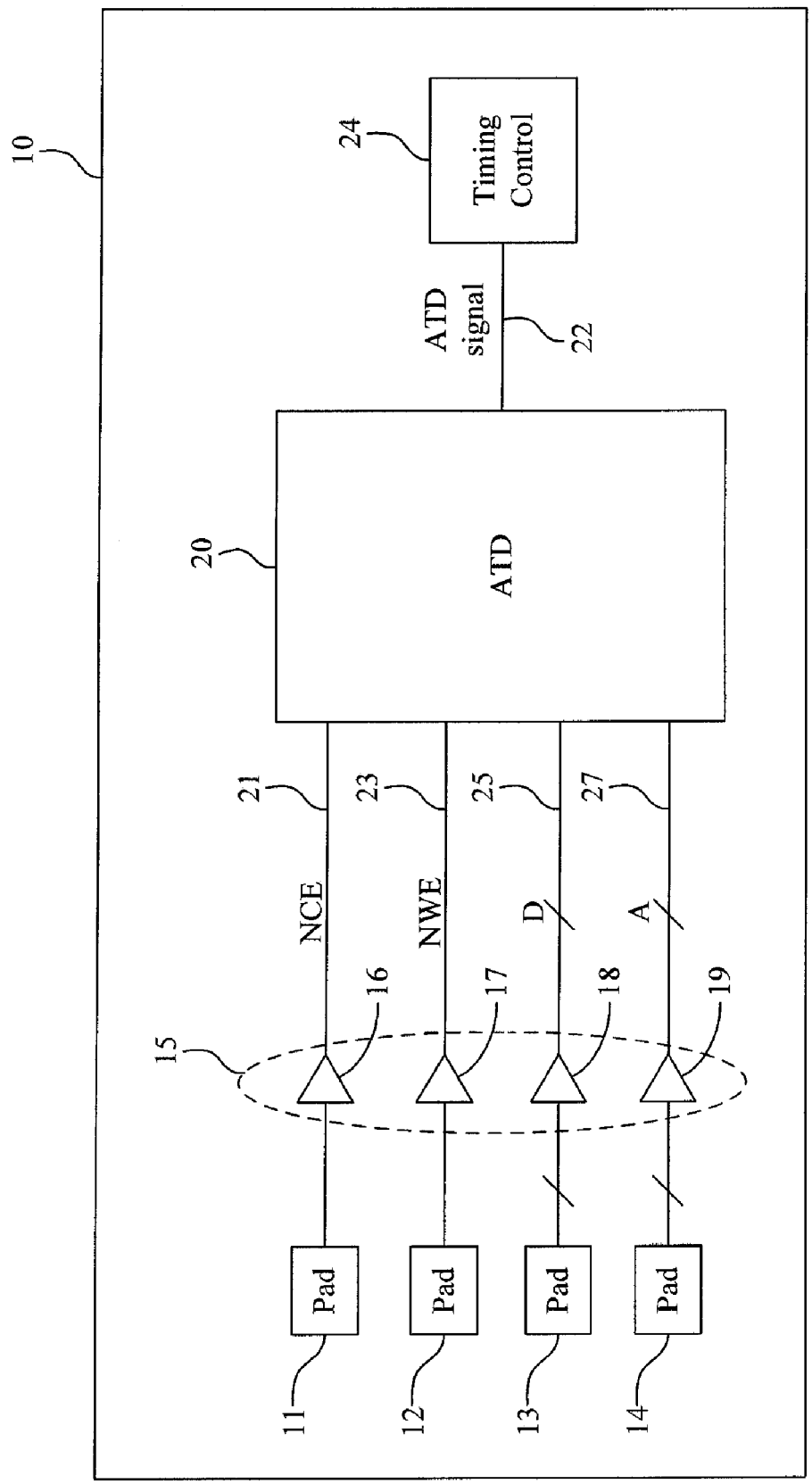
FIG. 1 shows a top view of an MRAM with an extended address transition detection circuit utilizing methods according to the embodiment of the present invention

Reference will now be made in detail to the present preferred embodiments of the invention, examples of which are illustrated in the accompanying drawings. Wherever possible, the same reference numbers are used in the drawings and the description to refer to the same or like parts.

An MRAM according to the embodiment of the present invention is shown in the drawings and generally designated 10. The MRAM 10 has an extended address transition detection circuit, e.g. an address transition device (ATD) circuit 20, driving a timing control block 24. According to the embodiment of the present invention, the ATD circuit 20 has four inputs separately for a chip enable (NCE) signal 21, a write enable (NWE) signal 23, a Data bus 25, and an Address bus 27. The input signals come from off-chip and are buffered using buffer group 15. The NCE signal 21 is driven by a line buffer 16. The NWE signal 23 is driven by a line buffer 17. The Data bus 25 is driven by a line buffer 18. The Address bus 27 is driven by a line buffer 19.

External pad 11 feeds the line buffer 16. External pad 12 feeds the line buffer 17. External pad 13 feeds the line buffer 18. External pad 14 feeds the line buffer 19. The NCE signal 21 is a chip enable signal. The New signal 23 is a read/not write signal 23. The output of the ATD circuit 20 is an ATD signal 22. The ATD signal 22 is provided to timing control block 24. The internal clocking pulse for an asynchronous MRAM 10 is provided by the ATD circuit 20. The external pads, 11, 12, 13 and 14 allow the ATD circuit 20 to be driven off chip.

The operation of an asynchronous MRAM 10 requires an internally generated clocking pulse called the ATD signal 22. To assure proper start and completion of operational cycles, an asynchronous MRAM 10 requires an internal clocking signal pulse to begin each operational cycle. The ATD signal 22 provides this internal clocking signal.

The main purpose of the ATD circuit 20 is to create the timing pulse, the ATD signal 22. The ATD circuit 20 allows a window of time in which all the controlled signals are allowed to switch states. After a period of time from the last transition of any of these signals, the ATD circuit 20 will generate a timing pulse on the ATD signal 22. This timing pulse, the ATD signal 22, is used as the internal clock pulse to initiate an operational cycle, either a read or write operation cycle. The delay and duration of the ATD signal 22 pulse is dictated by the design specifications.

An important result of using the ATD circuit 20 is a reduction of the amount of power used by the MRAM 10 during operation. If the input signals, the NCE signal 21, the NWE signal 23, the Data bus 25, and the Address bus 27 were unfettered and allowed to elicit internal responses, then each transition would do so and thus consume electrical switching power. To limit the MRAM 10 to not start an operational cycle until the last input signal transitions reduces this internal switching power.

It is in the timing control block 24 that the internal clocking signal, the ATD signal 22, from the ATD 20 is used to initiate a read or a write operation.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A magnetic random access memory comprising:
    an extended address transition detection circuit having a chip enable input, a chip write enable input, a data bus connection, an address bus connection, with the extended address transition detection circuit having an extended transition detection signal output, wherein the extended transition detection signal is a clocking pulse signal for beginning operational cycle for an asynchronous MRAM; and
    a timing controller having a timing control input connected to the extended transition detection signal output.

2. The magnetic random access memory of claim 1, wherein the chip enable input is buffered.

3. The magnetic random access memory of claim 1, wherein the write enable input is buffered.

4. The magnetic random access memory of claim 1, wherein the address bus connection is buffered.

5. The magnetic random access memory of claim 1, wherein the data bus connection is buffered.

* * * * *